(12) United States Patent
Chen et al.

(10) Patent No.: US 11,257,922 B2
(45) Date of Patent: Feb. 22, 2022

(54) SELF-ALIGNED CONTACT AND METHOD FOR FORMING THE SAME

(71) Applicant: Winbond Electronics Corp., Taichung (TW)

(72) Inventors: Sih-Han Chen, Huatan Township, Changhua County (TW); Chien-Ting Chen, Tainan (TW); Yao-Ting Tsai, Kaohsiung (TW); Hsiu-Han Liao, Hsinchu (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/374,162

(22) Filed: Apr. 3, 2019

(65) Prior Publication Data

US 2019/0305110 A1  Oct. 3, 2019

(30) Foreign Application Priority Data

Apr. 3, 2018  (TW) .................................. 107111841

(51) Int. Cl.
  *H01L 29/66* (2006.01)
  *H01L 29/45* (2006.01)
  *H01L 21/285* (2006.01)

(52) U.S. Cl.
  CPC .. *H01L 29/66515* (2013.01); *H01L 21/28568* (2013.01); *H01L 29/45* (2013.01); *H01L 29/6653* (2013.01)

(58) Field of Classification Search
  CPC ......... H01L 29/66515; H01L 21/28568; H01L 29/45; H01L 29/6653
  See application file for complete search history.

(56) References Cited

U.S. PATENT DOCUMENTS 7,932,143 B1 * 4/2011 Pal .................... H01L 21/28123
                                                257/E21.616
8,133,777 B1  3/2012 Chiang et al.
(Continued)

FOREIGN PATENT DOCUMENTS

CN  1832131 A  9/2006

OTHER PUBLICATIONS

Office Action dated Jan. 22, 2021 in Chinese Application No. 201810303653.5, 7 pages.

*Primary Examiner* — Fernando L Toledo
*Assistant Examiner* — Valerie N Newton
(74) *Attorney, Agent, or Firm* — Muncy, Geissler, Olds & Lowe, P.C.

(57) ABSTRACT

A method for forming a self-aligned contact includes providing a substrate with a plurality of gate structures formed on the substrate. The method also includes forming a spacer liner on the gate structures and the substrate. The method also includes forming a sacrificial layer between the gate structures and on the gate structures. The method also includes forming a plurality of dielectric plugs through the sacrificial layer above the gate structures. The method also includes removing the sacrificial layer to form a plurality of contact openings between the gate structures. The method also includes forming an etch resistant layer conformally covering the sidewall and the bottom of the contact openings. The method also includes forming a plurality of contact plugs in the contact openings.

13 Claims, 17 Drawing Sheets

(56) References Cited

U.S. PATENT DOCUMENTS

| | | | |
|---|---|---|---|
| 8,872,244 B1* | 10/2014 | He | H01L 21/76832 257/288 |
| 8,928,048 B2* | 1/2015 | Xie | H01L 29/41791 257/288 |
| 9,153,498 B2 | 10/2015 | Xie et al. | |
| 2010/0038723 A1* | 2/2010 | Babich | H01L 21/76816 257/384 |
| 2011/0006437 A1* | 1/2011 | Tsao | H01L 21/31144 257/774 |

* cited by examiner

SELF-ALIGNED CONTACT AND METHOD FOR FORMING THE SAME

CROSS REFERENCE TO RELATED APPLICATIONS

This application claims the benefit of Taiwan Patent Application No. 107111841 filed on Apr. 3, 2018, entitled "SELF-ALIGNED CONTACT AND METHOD FORMING THE SAME" which is hereby incorporated herein by reference.

BACKGROUND

Technical Field

The disclosure relates to a semiconductor structure and more particularly to a self-aligned contact and a method for forming a self-aligned contact.

Description of the Related Art

As integrated circuits have shrunk, the space between the self-aligned contact (SAC) structures and the gate structures has decreased. Therefore, the possibility of a short circuit generating leakage current has increased. Traditionally, a sidewall spacer may be consumed during the formation of self-aligned contact structures. Such incomplete sidewall spacers may not effectively isolate the self-aligned contact structures from the gate structures and may result in leakage current between the gate structures and the self-aligned contact structures after a cycling operation.

BRIEF SUMMARY

The present disclosure provides a method for forming a self-aligned contact. The method includes providing a substrate with a plurality of gate structures formed on the substrate. The method also includes forming a spacer liner on the gate structures and the substrate. The method also includes forming a sacrificial layer between the gate structures and on the gate structures. The method also includes forming a plurality of dielectric plugs through the sacrificial layer above the gate structures. The method also includes removing the sacrificial layer to form a plurality of contact openings between the gate structures. The method also includes conformally forming an etch resistant layer covering the sidewall and the bottom of the contact openings. The method also includes forming a plurality of contact plugs in the contact openings.

A detailed description is given in the following embodiments with reference to the accompanying drawings.

DETAILED DESCRIPTION

The embodiments of the present disclosure provide a method of forming a self-aligned contact. An etch resistant layer is formed on the sidewall and the bottom of the contact opening, and the etch resistant layer is densified by a thermal process. The etch resistant layer provides effective electrical isolation to compensate the damaged spacer liner on the upper sidewall of the gate structure, which is caused by removing the sacrificial layer when forming the self-aligned contact structure. Therefore, leakage current between the gate structure and the self-aligned contact structure may be prevented.

Figure 1:
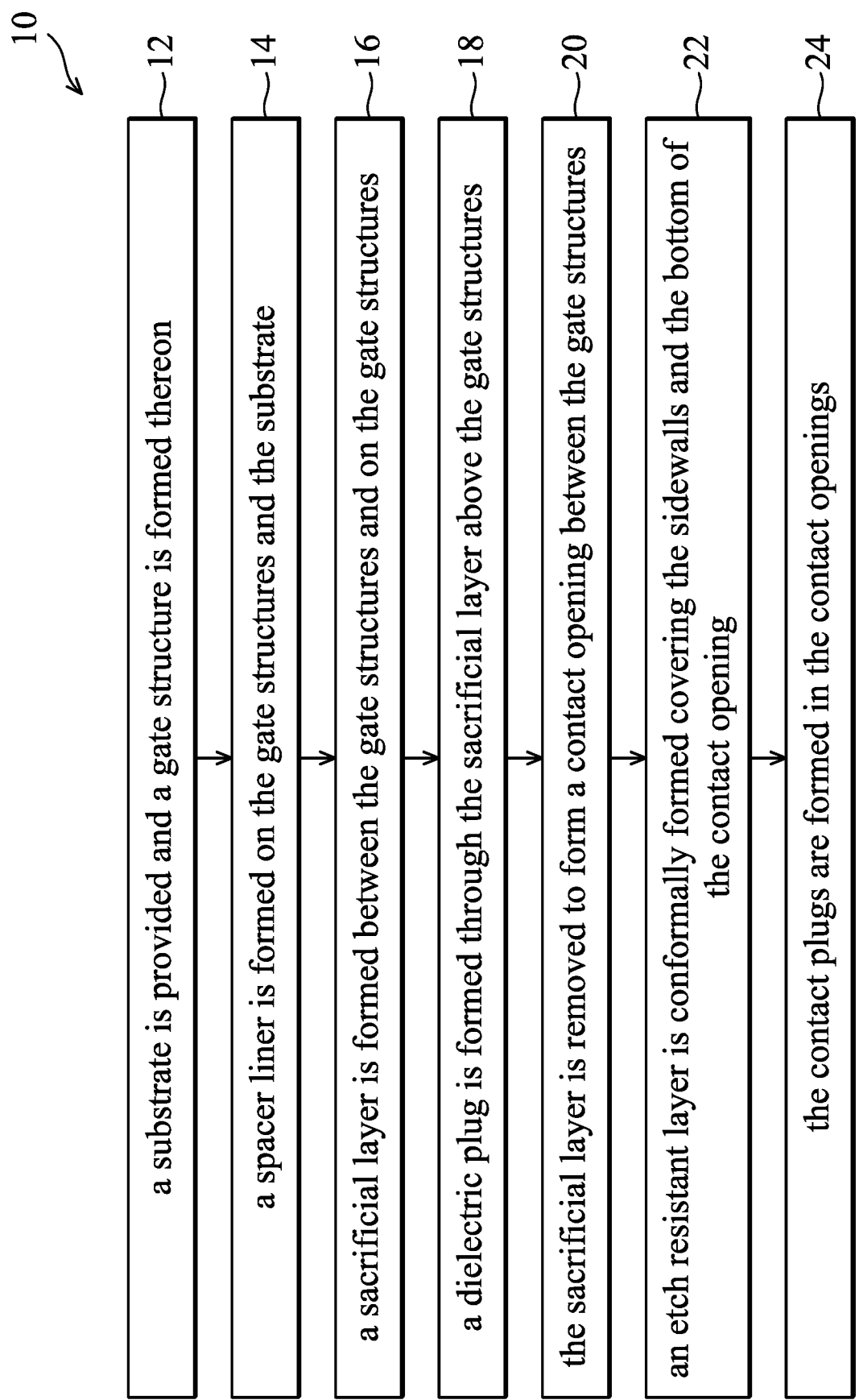
FIG. 1 is a flow chart of a method for forming a self-aligned contact in accordance with some embodiments.

FIG. 1 is a flow chart of a method 10 for forming a self-aligned contact 100 in accordance with some embodiments. FIGS. 2-12 are cross-sectional representations of various stages of forming the self-aligned contact 100 in accordance with some embodiments of the present disclosure. In the following paragraphs, the embodiments of the present disclosure will be described with reference to the flowchart in FIG. 1 and the cross-sectional views illustrated in FIGS. 2-12.

Figure 2:
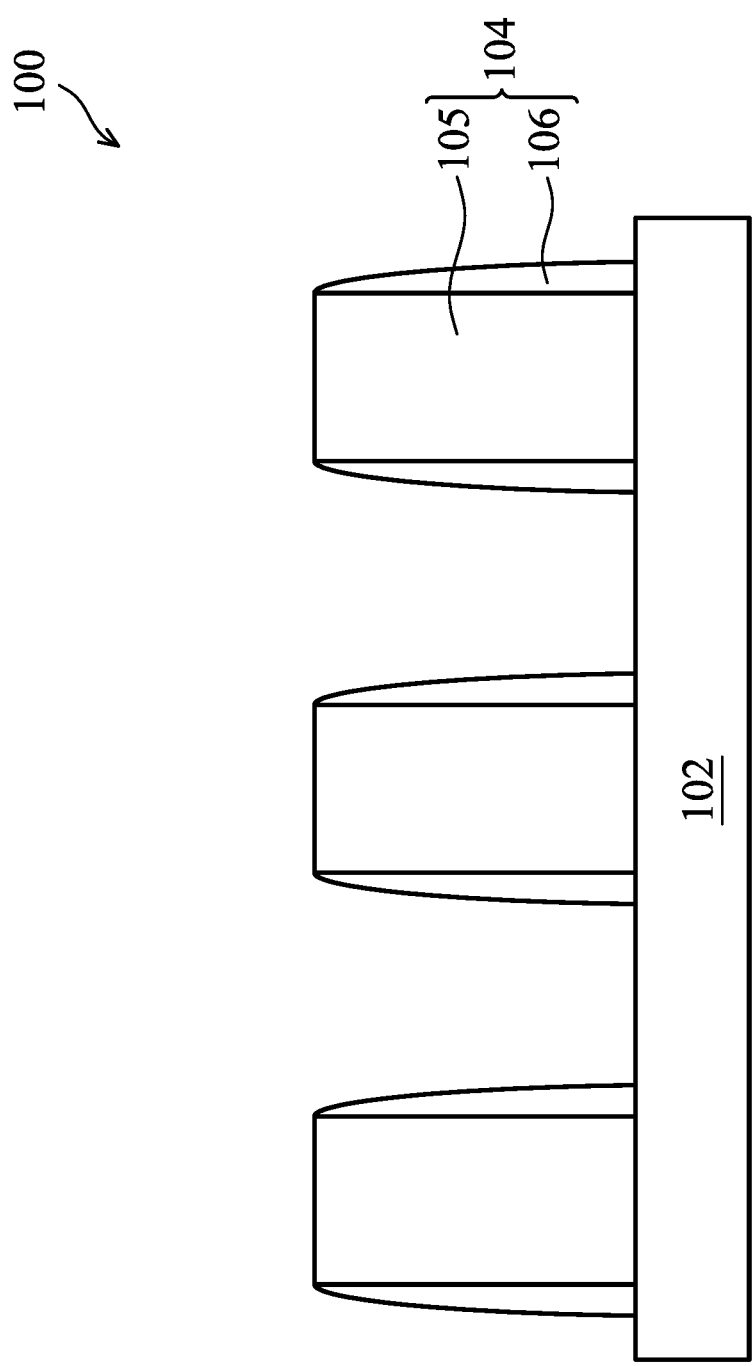
FIGS. 2-12 are cross-sectional representations of various stages of forming a self-aligned contact in accordance with some embodiments.

As shown in FIGS. 1 and 2, the method 10 begins with step 12, in which a substrate 102 is provided and a gate structure 104 is formed thereon. The gate structure 104 includes a gate 105 and a spacer 106.

In some embodiments, the substrate 102 in FIG. 2 may be a semiconductor substrate, which may include elementary semiconductors such as Si or Ge; compound semiconductors such as GaN, SiC, GaAs, GaP, InP, InAs, or InSb; alloy semiconductors such as SiGe, GaAsP, AlInAs, AlGaAs, GaInAs, GaInP, GaInAsP, or a combination thereof. In addition, the substrate 102 may also be semiconductor on insulator (SOI).

Next, a gate structure 104 is formed on the substrate 102. The gate structure 104 includes the gate 105 and the spacers 106 formed on the opposite sidewalls of the gate 105. In some embodiments, the gate 105 includes a gate dielectric layer and a gate electrode layer (now shown). The gate dielectric layer may include silicon oxide, silicon nitride, or silicon oxynitride, high-k dielectric (e.g., the dielectric constant is greater than 3.9) materials such as $HfO_2$, LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfSiO, LaSiO, AlSiO, $(Ba, Sr)TiO_3$, $Al_2O_3$, or a combination thereof. The gate dielectric layer may be formed by applicable oxidation processes (such as a dry oxidation process or a wet oxidation process), deposition processes (such as a chemical vapor deposition process or an atomic layer deposition process), other applicable processes, or a combination thereof. In some embodiments, the gate dielectric layer may be thermally grown by a thermal oxidation process in oxygen-containing ambient or nitrogen-containing ambient (such as NO or $N_2O$) prior to forming the gate electrode layer.

In some embodiments, a gate electrode layer is formed on the gate dielectric layer. The gate electrode layer may include polycrystalline-silicon (poly-Si), metals (such as tungsten, titanium, aluminum, copper, molybdenum, nickel, platinum, the like, or a combination thereof), metal alloys, metal-nitrides (such as tungsten nitride, molybdenum nitride, titanium nitride, and tantalum nitride, the like, or a combination thereof), metal-silicides (such as tungsten silicide, titanium silicide, cobalt silicide, nickel silicide, platinum silicide, erbium silicide, the like, or a combination thereof), metal-oxides (such as ruthenium oxide, indium tin oxide, the like, or a combination thereof), other applicable materials, or a combination thereof. The gate electrode layer may be formed by forming an electrode material on the substrate 102 by a chemical vapor deposition process (such as a low pressure chemical vapor deposition process (LPCVD), or a plasma enhanced chemical vapor deposition process (PECVD)), a physical vapor deposition process (such as a resistive heating evaporation process, an e-beam evaporation process, or a sputtering process), an electroplating process, an atomic layer deposition (ALD) process, other applicable processes, or a combination thereof. The electrode material is then patterned by a photolithography and an etching process to form the gate electrode.

In some embodiments, the spacers 106 are formed on the opposite sides of the gate 105. The spacers 106 may be oxides, nitrides, oxynitrides, a high k material, a low k material, or a combination thereof. The precursor material or gaseous reactants of forming the spacers 106 may include TRIES (triethoxysilane), TEOS (tetraethoxysilane), BTBAS (bis(tert-butylamino) silane), $O_2$, $N_2O$, NO, other gas or materials, or a combination thereof. In some embodiments, the spacer material may be conformally formed on the gate structures and the substrate by a chemical vapor deposition process (such as a high-density plasma chemical vapor deposition (HDPCVD) process, an atmospheric pressure chemical vapor deposition (APCVD) process, a low pressure chemical vapor deposition (LPCVD) process, or a plasma enhanced chemical vapor deposition (PECVD) process), an atomic layer deposition (ALD) process, other applicable techniques, or a combination thereof. After that, an anisotropic etch-back is performed on the spacer material and the spacers 106 are left on the opposite sides of the gate 105. In some embodiments, the etch-back may be a dry etch process, which may be performed using an oxygen-containing gas, a fluorine-containing gas (such as $CF_4$, $SF_6$, $CH_2F_2$, $CHF_3$, and/or $C_2F_6$), a chlorine-containing gas (such as $Cl_2$, $CHCl_3$, $CCl_4$, and/or $BCl_3$), a bromine-containing gas (such as HBr and/or $CHBR_3$), an iodine-containing gas, other suitable gases and/or plasmas, or a combination thereof.

Figure 3:
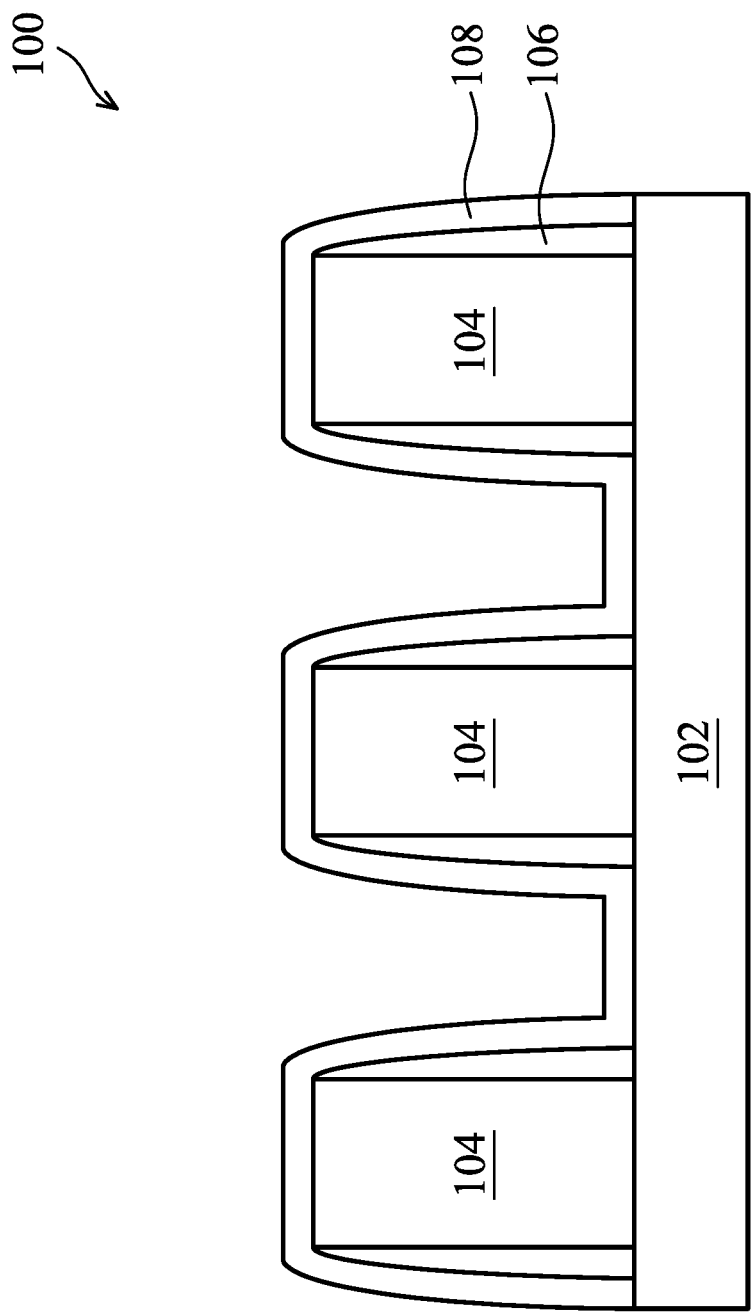
Figure 4:
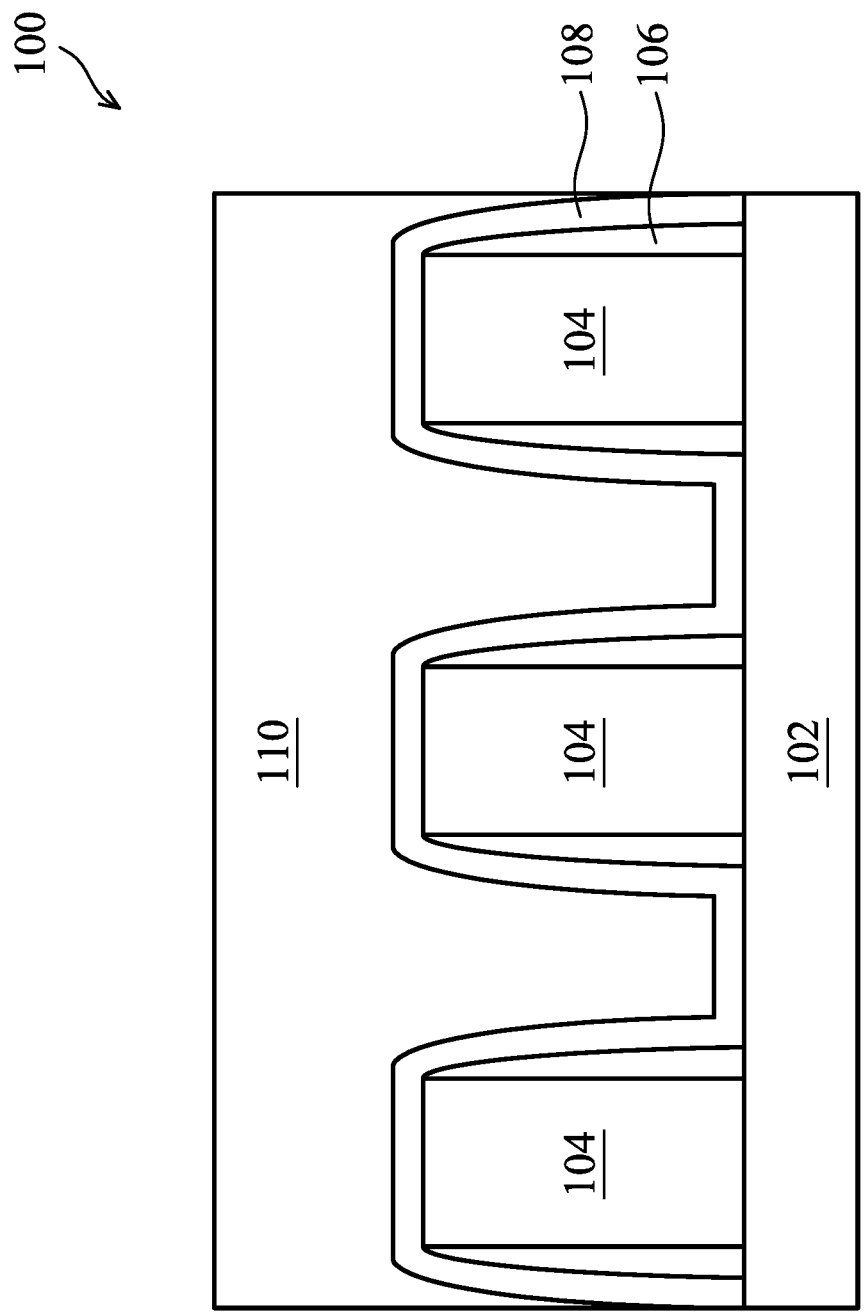

Next, as shown in FIGS. 1 and 3, the method 10 proceeds to step 14, in which a spacer liner 108 is formed on the gate structures 104 and the substrate 102. In some embodiments, the spacer liner 108 may be oxides, nitrides, oxynitrides, a high k material, a low k material, or a combination thereof. The precursor material or gaseous reactants of forming the spacer liner 108 may include TRIES (triethoxysilane), TEOS (tetraethoxysilane), BTBAS (bis(tert-butylamino) silane), $O_2$, $N_2O$, NO, other gas or materials, or a combination thereof. Next, as shown in FIGS. 1 and 4, the method 10 proceeds to step 16, in which a sacrificial layer 110 is formed between the gate structures 104 and on the gate structures 104. In some embodiments, the sacrificial layer 110 may include polysilicon, silicon-rich oxides, oxynitrides, aluminium oxide, or a combination thereof.

Figure 5:
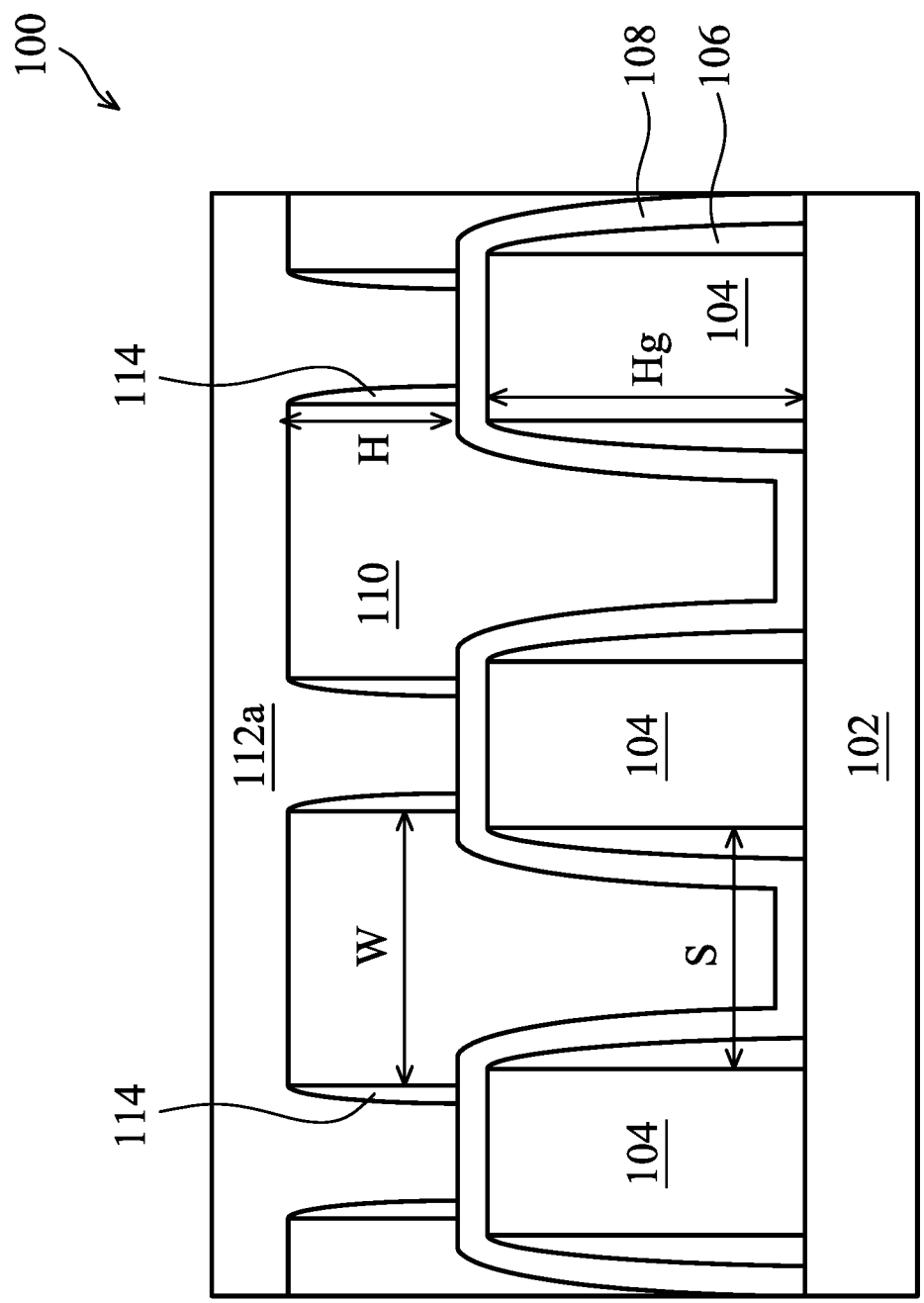
Figure 6:
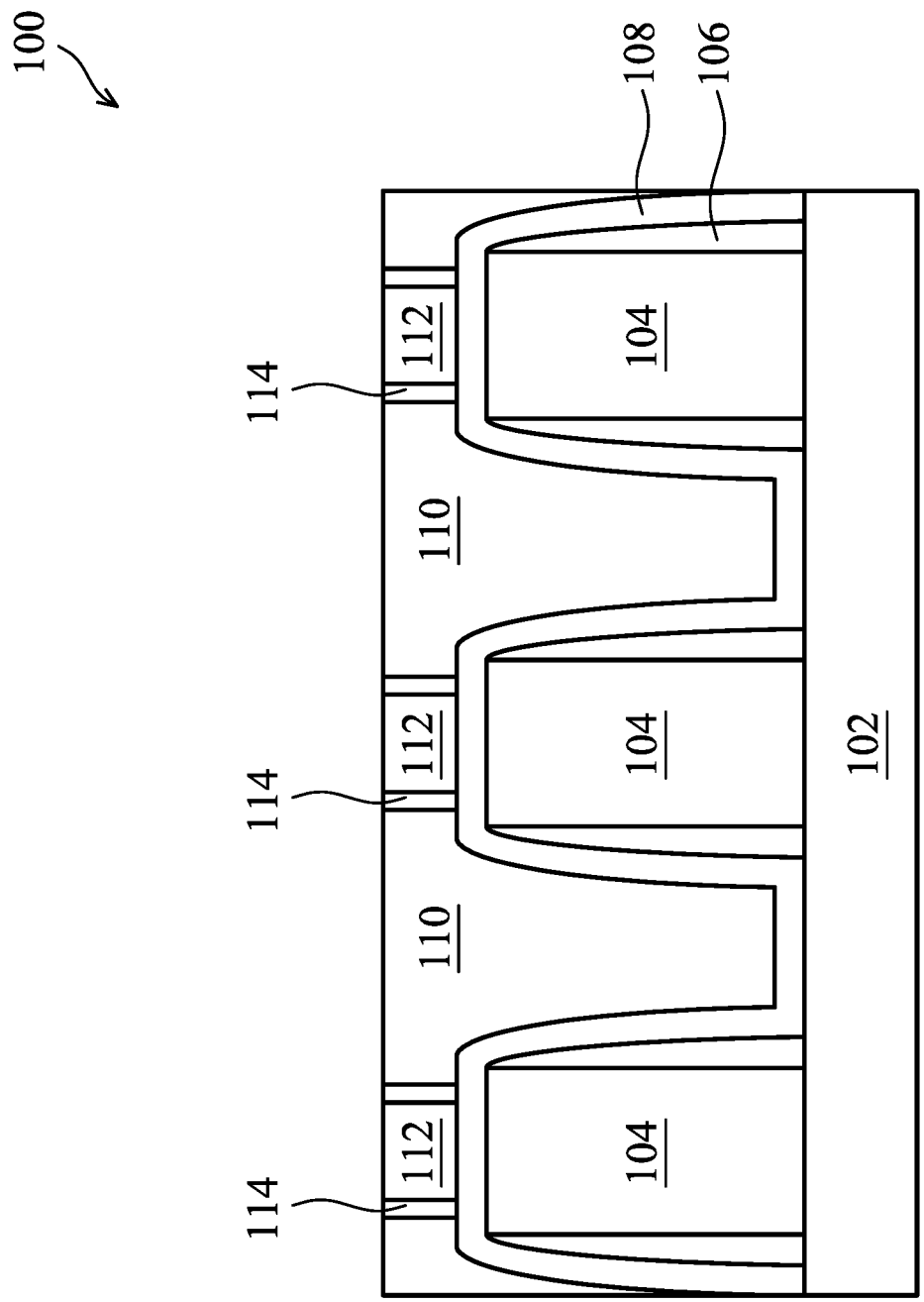

Next, as shown in FIGS. 1, 5 and 6, the method 10 proceeds to step 18, in which a dielectric plug 112 is formed through the sacrificial layer 110 above the gate structures 104. In some embodiments, before forming the dielectric plugs 112, a hole is formed in the sacrificial layer 110 above the gate structures 104 by a patterning process such as a photolithography process and an etching process (not shown). The photolithography process may include photoresist coating (e.g., spin-on coating), soft baking, mask aligning, exposure, post-exposure baking, developing the photoresist, rinsing and drying (e.g., hard baking), other applicable techniques, or a combination thereof. The etching process may include a dry etching process (e.g., reactive ion etching (RIE), anisotropic plasma etching), a wet etching process, or a combination thereof. In some embodiments, after forming holes on the gate structures 104, spacers 114 are formed on the sidewalls of the holes. In some embodiments, the materials of the spacers 114 and the spacer liner 108 are the same. In some embodiments, the spacer material is conformally deposited in the holes and on the sacrificial layer 110 by a deposition process, and then an anisotropic etching-back is performed on the spacer material, leaving the spacers 114 on the two sidewalls of the holes. The deposition processes and the etching processes used to form the spacers 114 may be similar to, or the same as, those used to form the spacer 106 and are not repeated herein.

After forming the holes in the sacrificial layer 110 above the gate structures 104 and the spacers 114 on its sidewalls, a dielectric plug 112 is formed in the holes in the sacrificial layer 110 above the gate structures 104. First, as shown in FIG. 5, a dielectric material 112a is filled in the holes and on the sacrificial layer 110. In some embodiments, the dielectric material 112a includes silicon oxide, silicon nitride, silicon oxynitride, tetraethoxysilane (TEOS), phosphosilicate glass (PSG), borophosphosilicate glass (BPSG), and/or other applicable dielectric materials. The dielectric material 112a may be filled in the holes and on the sacrificial layer 110.

Next, as shown in FIG. 6, a planarization process such as a chemical mechanical polishing (CMP) process or an etch-back process is performed to remove excess dielectric material 112a until the sacrificial layer 110 is exposed, and the dielectric plugs 112 are formed in the sacrificial layer 110 above the gate structures 104. The dielectric plugs 112 may protect the gate structures 104, preventing the mobile ions from affecting the device's reliability.

In some embodiments, the sacrificial layer 110 may be removed in a subsequent process and a self-aligned contact structure formed therein. In the process of removing the sacrificial layer 110, the spacer liner 108 may be consumed and the distance between the gate structures 104 and the self-aligned contact structure may be reduced, causing a short-circuit between the gate structures 104 and the self-aligned contact structure (which will be described in detail later).

In some embodiments as shown in FIG. 5, the maximum width W of the sacrificial layer 110 between the gate structures 104 is between 40% and 200% of the distance S between the gate structures 104. That is, the distance W between the spacers 114 on the adjacent gate structures 104 is between 40% and 200% of the distance S between the gate structures 104. If the width W is too wide, then the holes above the gate structures are too small to fill in the dielectric material to form dielectric plugs 112. If the width W is too narrow, the cross-sectional area of the subsequently formed self-aligned contact structure is too small, causing the contact resistance to rise.

In some embodiments as shown in FIG. 5, the height H of the sacrificial layer 110 between the gate structures 104 protruding from the gate structures 104 is between 10% and 100% of a height Hg of the gate structures 104. If the height H is too high, the etching time of the subsequently removing the sacrificial layer 110 may be longer, which may easily consume the spacer liner 108 at the top of the gate structure 104 and cause short-circuit between the subsequently formed contact plugs and gate structures 104. If the height H is too short, the height of the dielectric plug 112 is too short to protect the gate structures 104, and the mobile ions may affect the device's reliability.

Figure 7:
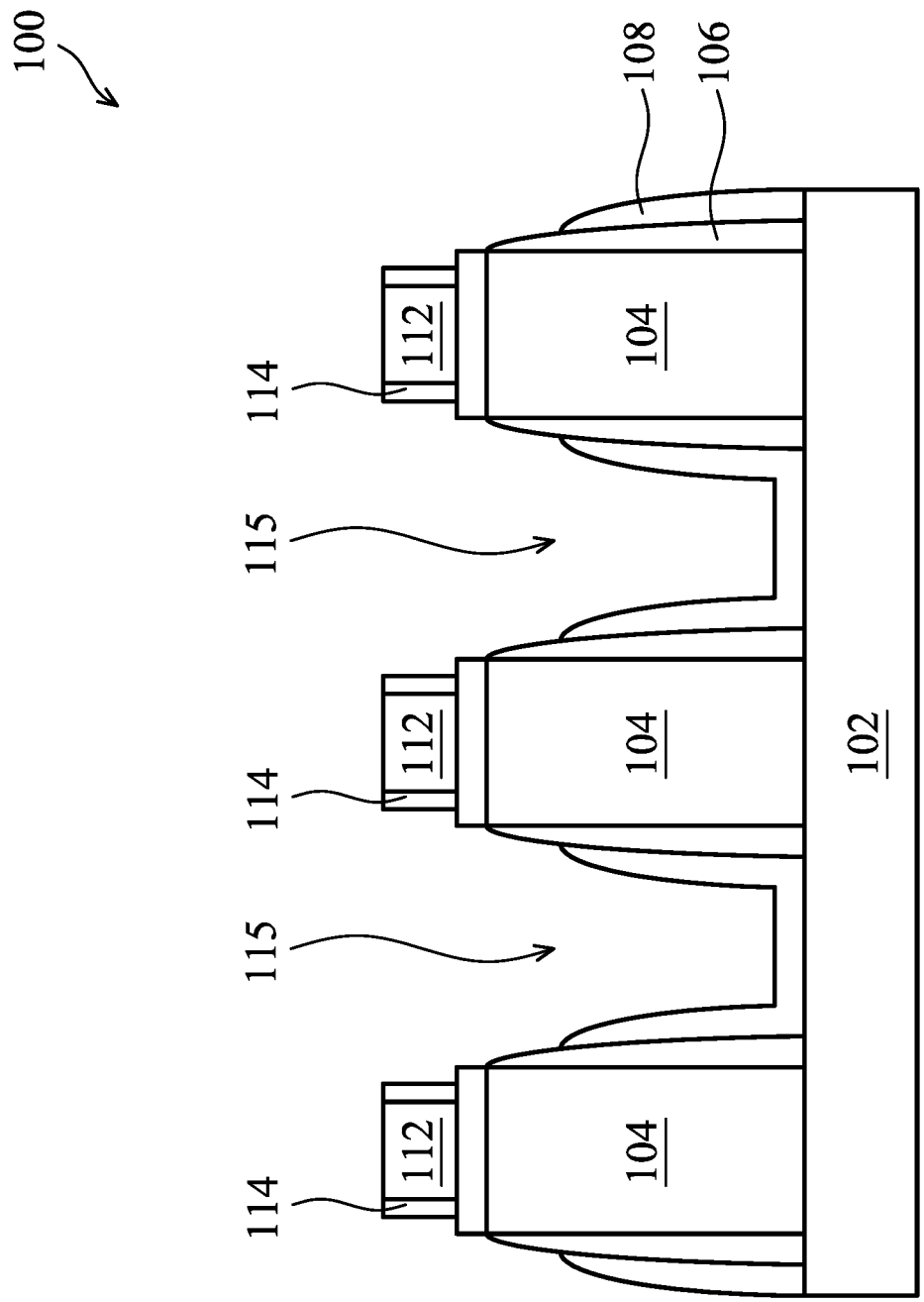

Next, as shown in FIGS. 1 and 7, the method 10 proceeds to step 20, in which the sacrificial layer 110 is removed to form a contact opening 115 between the gate structures 104. In some embodiments, the sacrificial layer 110 is removed by an etching process. The etching process may include a dry etching process, a wet etching process, a reactive ion etching process, and/or another suitable etching process. In some embodiments, a dry etch process may be performed using an oxygen-containing gas, a fluorine-containing gas (such as $CF_4$, $SF_6$, $CH_2F_2$, $CHF_3$, and/or $C_2F_6$), a chlorine-containing gas (such as $Cl_2$, $CHCl_3$, $CCl_4$, and/or $BCl_3$), a bromine-containing gas (such as HBr and/or $CHBR_3$), an iodine-containing gas, other suitable gases and/or plasmas, or a combination thereof. In some embodiments as shown in FIG. 7, after the sacrificial layer 110 is removed, the spacer liner 108 on the upper sidewall of the gate structures 104 is consumed and the upper portion of the gate structures 104 is exposed. In some embodiments, the etching selectivity of the spacer liner 108 and the spacers 106 are different. For instance, the spacer liner 108 is made of, for example, oxides, and the spacers 106 are made of, for example, nitrides. Therefore, when the etching selectivity is fine-tuned by, for example, a chlorine-containing gas, a bromine-containing gas, a fluorine-containing gas, or other suitable gases to remove the sacrificial layer 110, a part of the spacer liner 108 is consumed, and the upper portion of the gate structures 104 (including the spacer 106) is exposed.

Figure 8:
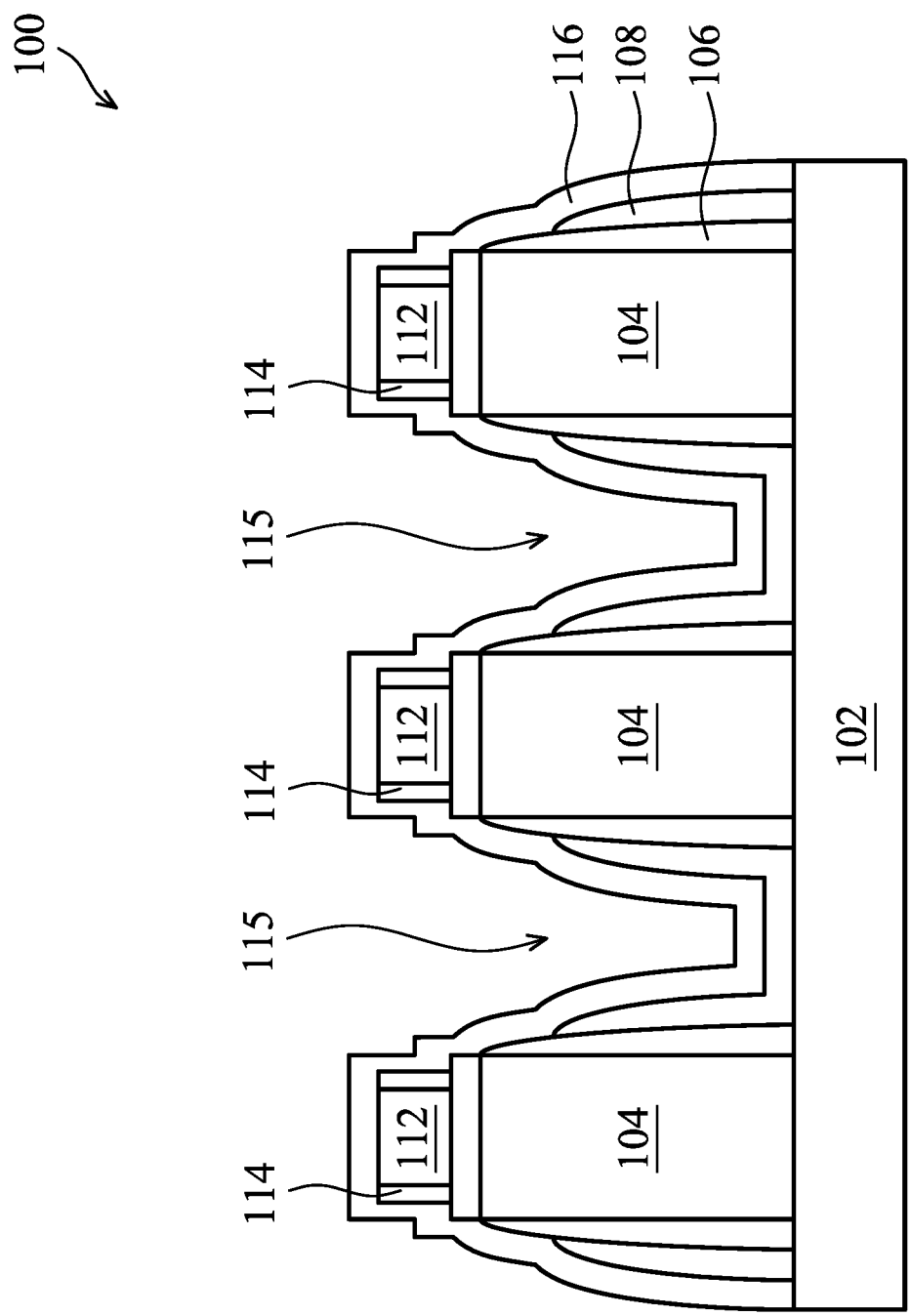
Figure 9:
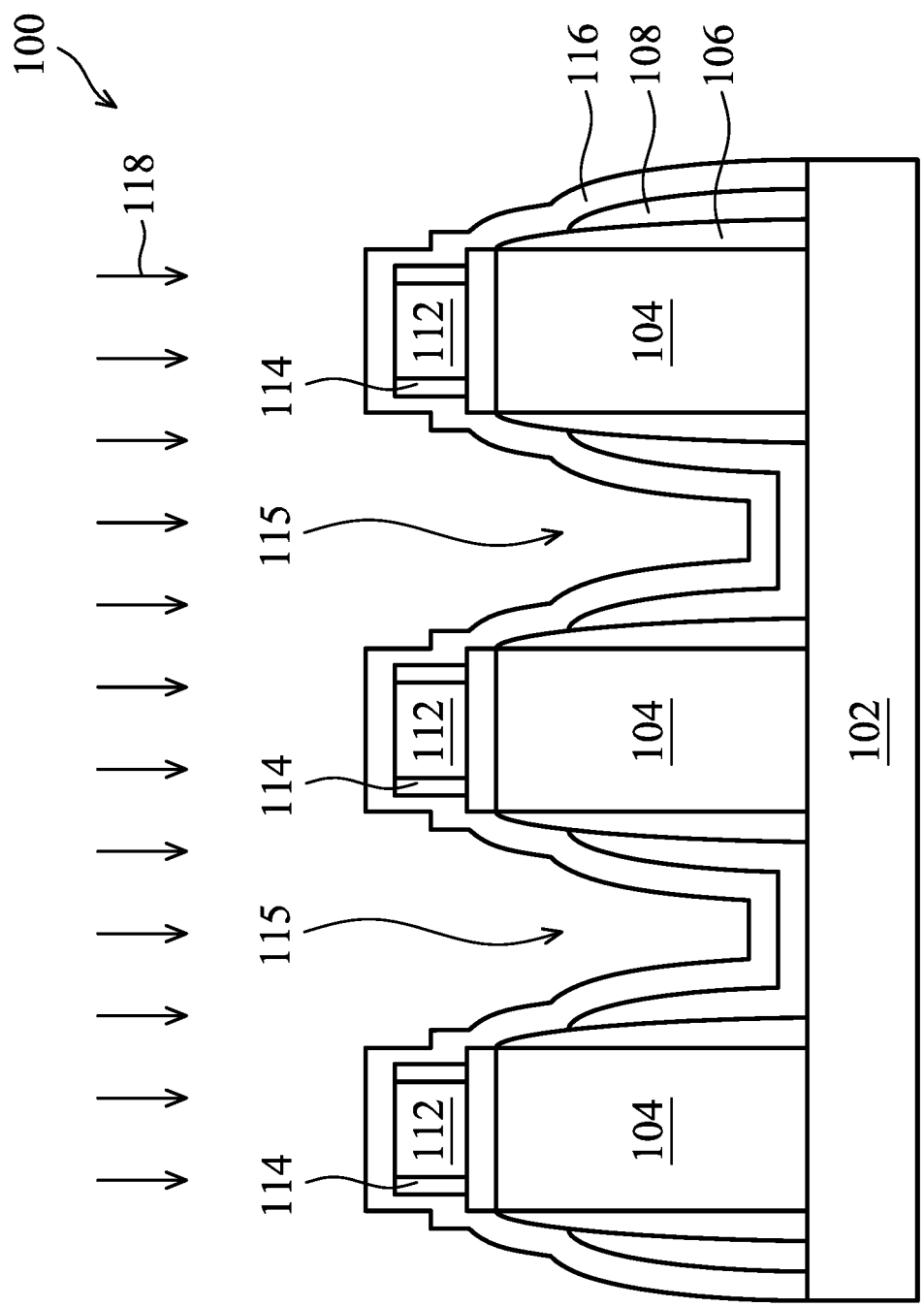

Next, as shown in FIGS. 1 and 8, the method 10 proceeds to step 22, in which an etch resistant layer 116 is conformally formed covering sidewalls and the bottom of the contact opening 115. In some embodiments, the etch resistant layer 116 and the spacer liner 108 are formed by the same material such as oxides. The etch resistant layer 116 may compensate the consumed part of the spacer liner 108 when removing the sacrificial layer 110, it may also prevent the spacer liner 108 on the upper sidewall of the gate structures 104 being further consumed in subsequent etching process. Therefore, the self-aligned contact structure subsequently formed in the contact opening 115 may maintain a proper distance from the gate structure 104, preventing short-circuiting due to the self-aligned contact structure being too close to the gate structures 104. Moreover, in some embodiments, the etch resistant layer 116 has a high selectivity with the material on the substrate 102 (such as nitride) (not shown) in the following etching process. Therefore, it is not easily etched, and the gate structures 104 may not be exposed. In some embodiments, the etch resistant layer 116 include oxides, nitrides, oxynitrides, a high k material, or a combination thereof. The precursor material or gaseous reactants of forming the etch resistant layer 116 may include TRIES (triethoxysilane), TEOS (tetraethoxysilane), BTBAS (bis(tert-butylamino) silane), $O_2$, $N_2O$, NO, other gas or materials, or a combination thereof. In some embodiments, the etch resistant layer 116 may be conformally formed on the sidewalls and the bottom of the contact openings 115. Next, as shown in FIG. 9, a thermal process 118 is performed on the etch resistant layer 116 to densify the etch resistant layer 116. In some embodiment, the thermal process 118 has a temperature of between 0° C. and 1000° C. and a duration of between 0 minutes and 100 minute. If the temperature is too high or the duration is too long, then the remaining oxidation layer in the contact opening 115 may be too thick. It may be not easy to remove the oxidation layer, thereby resulting in the contact being open. If the temperature is too low or the duration is too short, then the densification may not be enough to decrease the leakage current between the gate structure 104 and the subsequently formed self-aligned contact structure.

Figure 10:
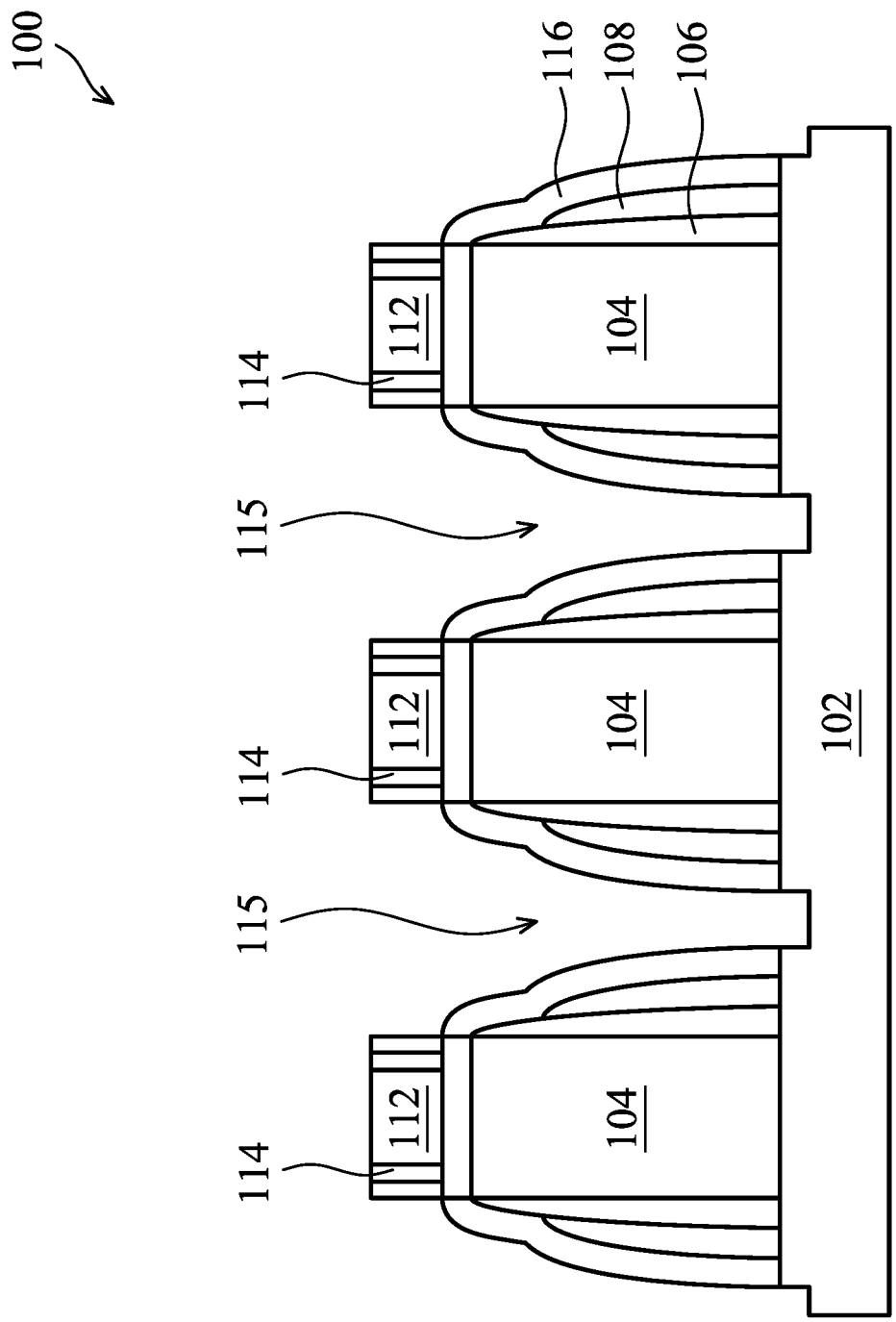

Next, as shown in FIGS. 1 and 10 to 12, the method 10 proceeds to step 24, in which the contact plugs 122 are formed in the contact openings 115. In some embodiments as shown in FIG. 10, the etch resistant layer 116 and the spacer liner 108 between the gate structures 104 are etched to expose the substrate 102. In some embodiments, the etch process may include anisotropic etch-back and/or other applicable process. In some embodiments, the substrate 102 is also etched when etching the etch resistant layer 116 and the spacer liner 108 between the gate structures 104, making the contact openings 115 between the gate structures 104 extending into the substrate 102. In some embodiments, the etching process has a greater vertical etching rate than its horizontal etching rate. Therefore the etch resistant layer 116 above the dielectric plug 112 is consumed and the dielectric plug 112 is exposed. If the etch resistant layer 116 is not formed, the spacer liner 108 may be further consumed to expose more portion of the gate structures 104, resulting in a short-circuit between the subsequently formed self-aligned contact structures and the gate structures 104 and producing a leakage current.

Figure 11:
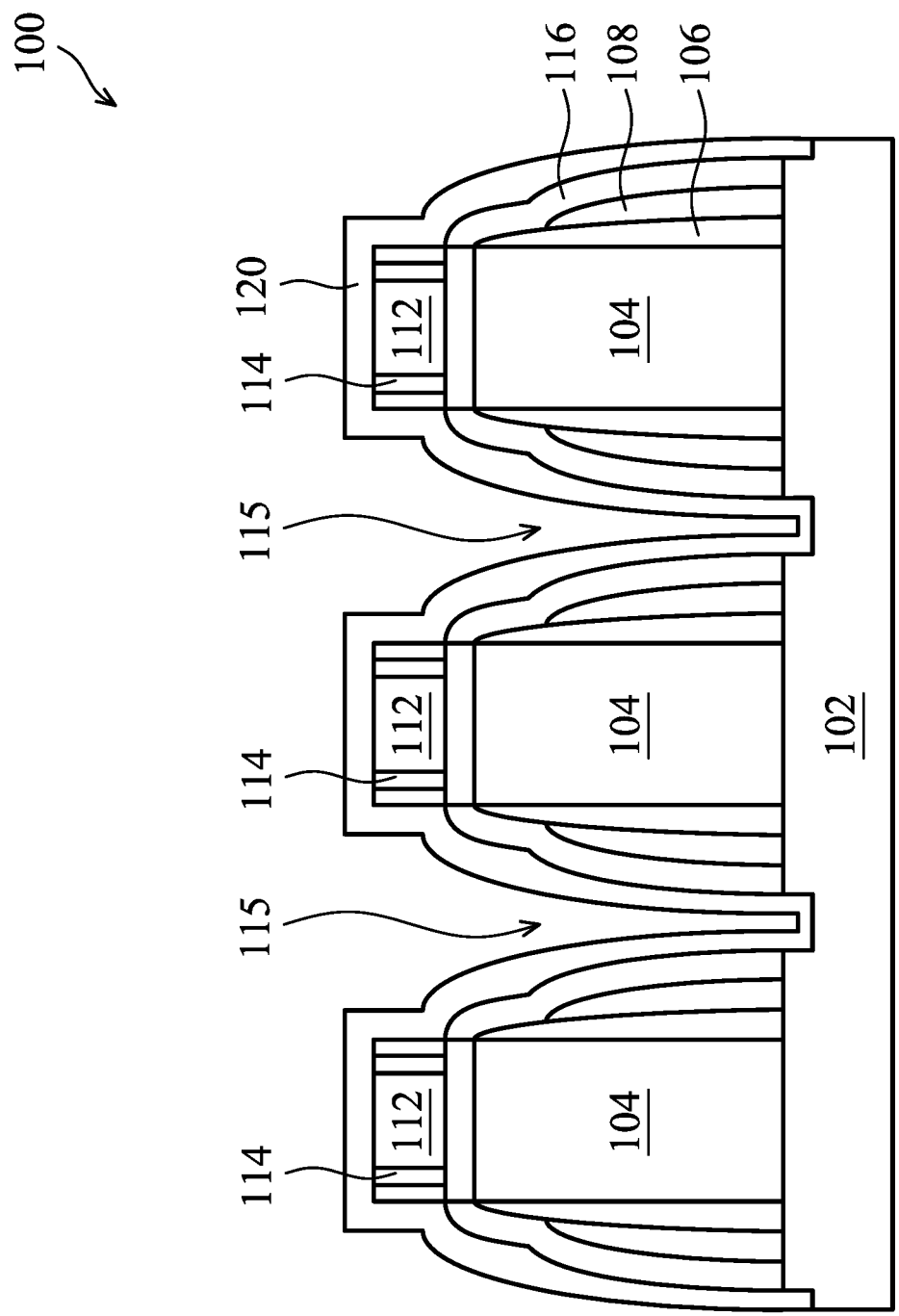
Figure 12:
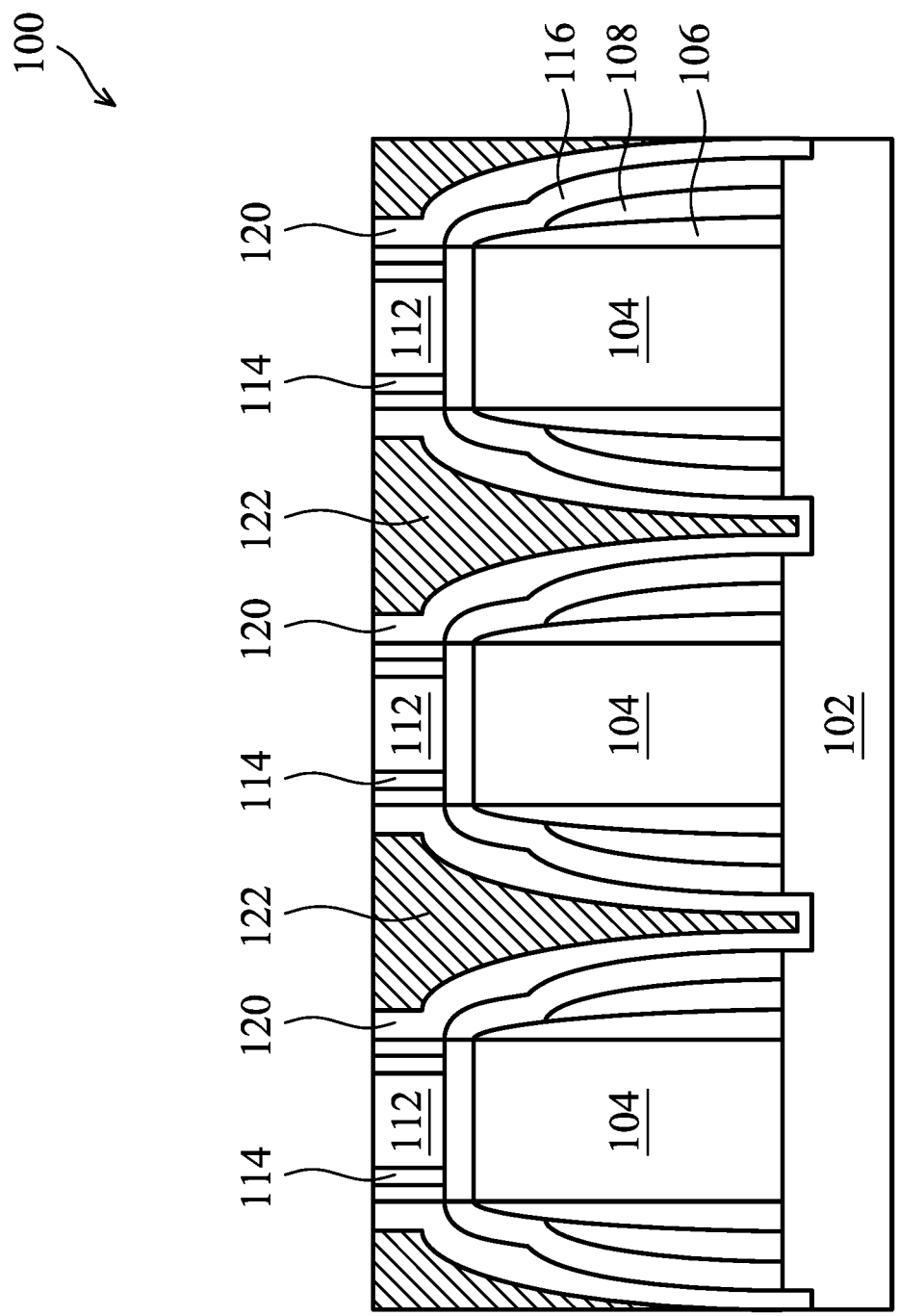

Next, as shown in FIG. 11, the barrier layer 120 is conformally formed on the sidewall and the bottom of the contact opening 115. The barrier layer 120 may prevent the subsequently formed conductive material from diffusing into the gate structures 104. The material of the barrier layer may be TiN, Ti, Ta, TaN, W, WN, other applicable materials, or a combination thereof. Next, as shown in FIG. 12, a conductive material is filled in the contact openings 115 to form contact plugs 122. The contact plug 122 may include metal material (such as W, Al, or Cu), metal alloys, poly-Si, other applicable conductive materials, or a combination thereof. The conductive material may be deposited by physical vapor deposition (PVD) (such as evaporation or sputtering), atomic layer deposition (ALD), electroplating, other applicable processes, or a combination thereof. The excess conductive material is then removed by optionally performing chemical mechanical polishing (CMP) or etching-back to form contact plugs 122.

In some embodiments as shown in FIGS. 1 and 2 to 12, by conformally forming the etch resistant layer 116 on the sidewalls of the gate structure 104 after removing the sacrificial layer 110, the damaged spacer liner 108 on the upper sidewalls of the gate structures 104 caused by removing the sacrificial layer 110 may be compensated. The contact plug 122 is prevented from being short-circuited with the gate structure 104 to generate a leakage current. Densifying the etch resistant layer 116 by the thermal process 118 may further improve the quality of the etch resistant layer 116, preventing leakage current between the subsequently formed contact plugs 122 and the gate structures 104.

Figure 13:
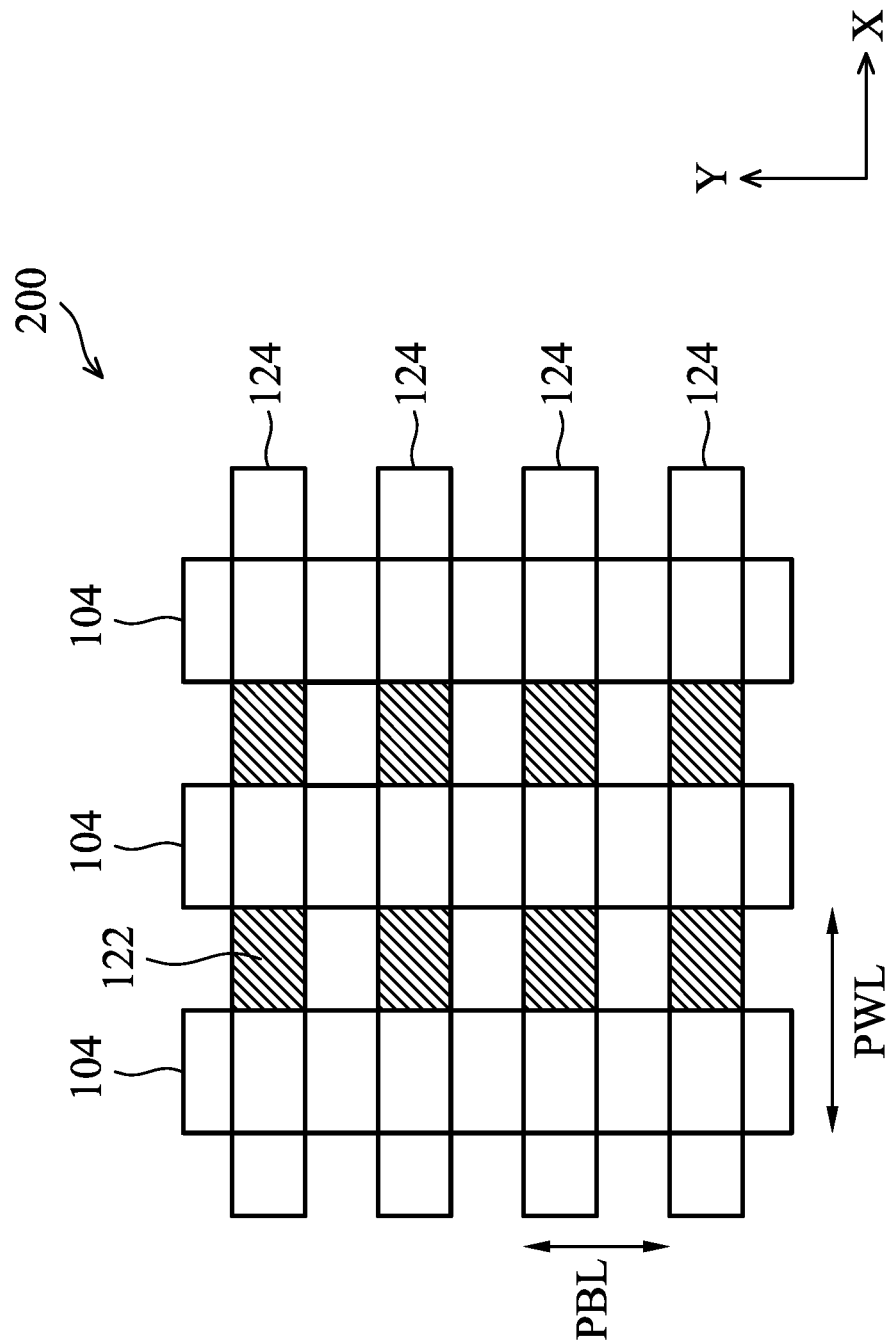
FIG. 13 is a layout of a self-aligned contact in accordance with some embodiments.

FIG. 13 is a layout 200 of a memory with self-aligned contact structures in accordance with some embodiments. The gate structures 104 (i.e., the word lines) extend along the Y-axis and are separated by a pitch PWL. The bit lines 124 extend along the X-axis and are separated by a pitch PBL. The X-axis and the Y-axis are perpendicular to each other. The contact plugs 122 are located at the intersection of the gate structures 104 and the bit lines 124. In some embodiments, the pitch PWL is between 0.1 µm and 0.3 µm, and the pitch PBL is between 0.05 µm and 0.2 µm. If the pitch PWL and PBL are too small, it may be not easy to form the contact plugs 122. If the pitch PWL and PBL are too great, the area of the array and the chip may be increased further.

Figure 14:
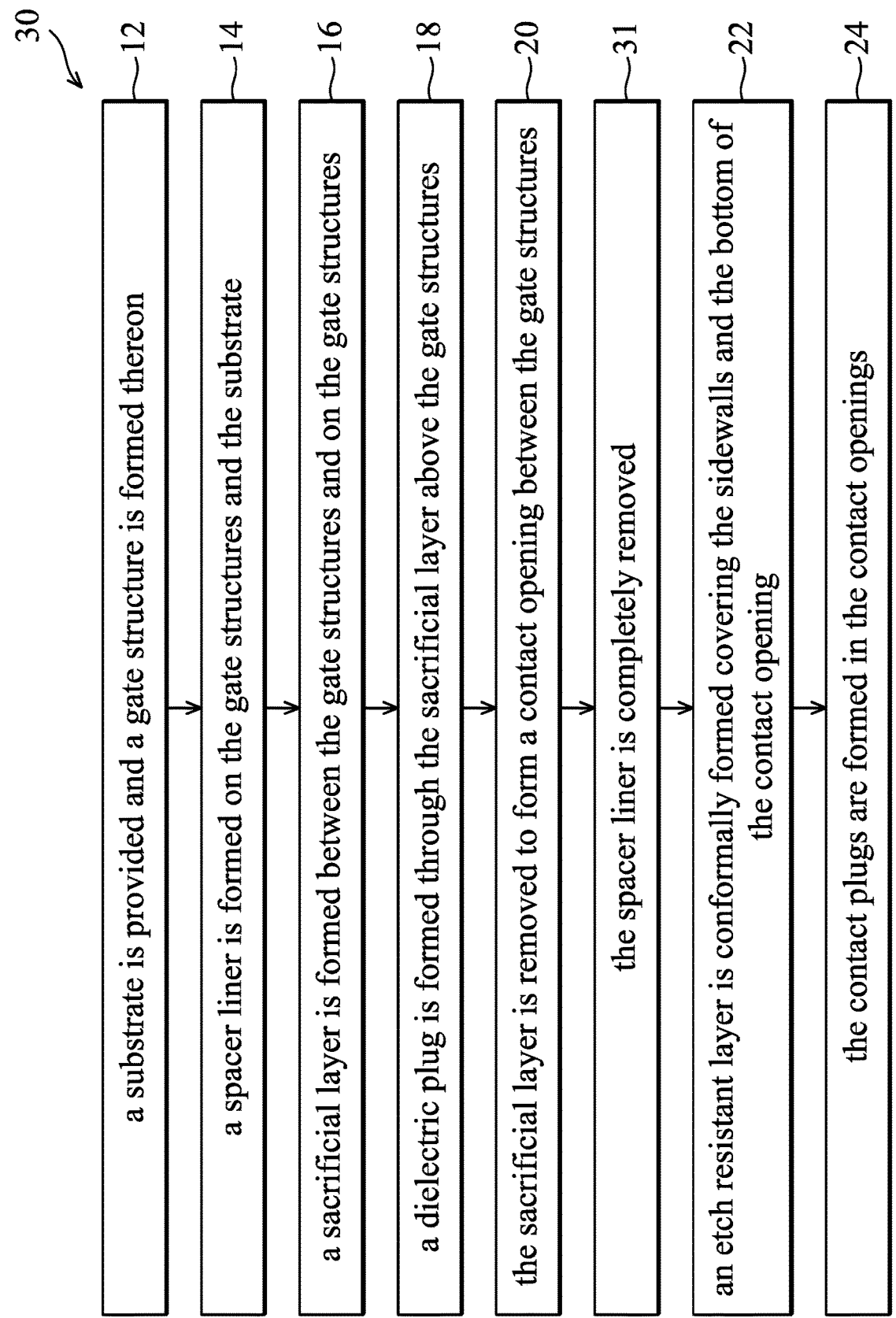
FIG. 14 is a flow chart of a method for forming a self-aligned contact in accordance with some other embodiments.
Figure 15:
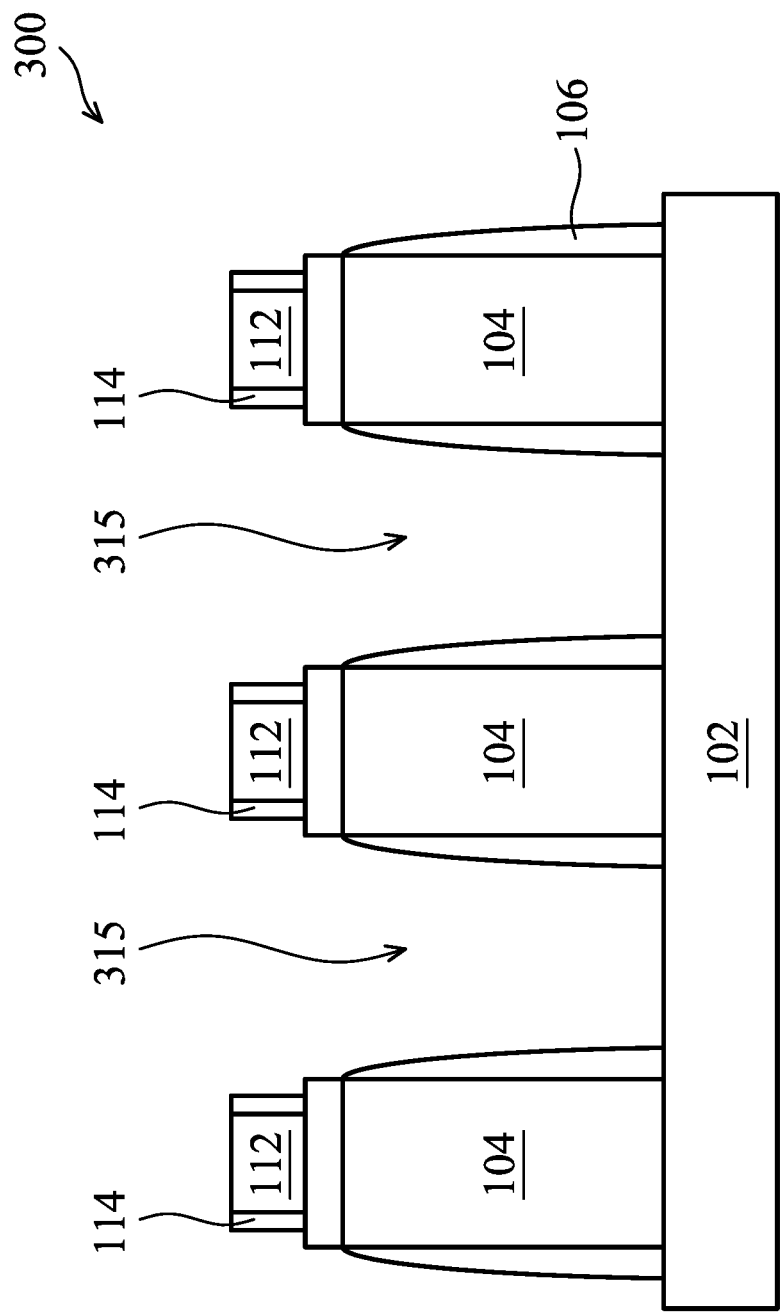
FIGS. 15-17 are cross-sectional representations of various stages of forming a self-aligned contact in accordance with some other embodiments.
Figure 16:
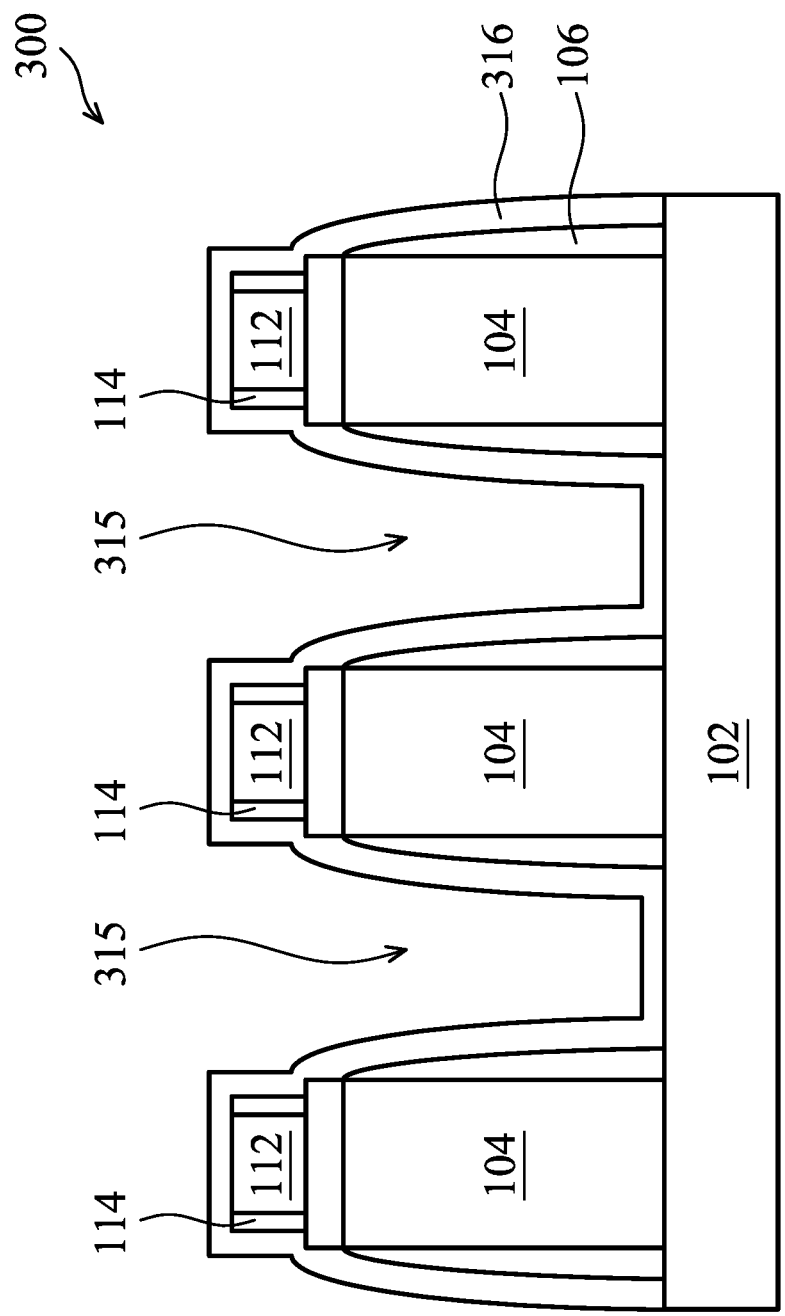

FIGS. 14 to 17 describe a variation of the foregoing embodiment. FIG. 14 is a flow chart of a method 30 for forming a self-aligned contact 300 in accordance with some other embodiments. FIGS. 15 and 16 follow FIG. 7, are cross-sectional representations of various stages of forming a self-aligned contact 300 in accordance with some other embodiments. Some processes or devices are the same as, or similar to, those described in the embodiments above, and therefore the reference numerals and/or letters may be repeated. For the purpose of brevity, the descriptions of these processes and devices are not repeated herein. The difference from the embodiments described above is that, after removing the sacrificial layer 110, the step 31 is performed and the spacer liner 108 is completely removed. As shown in FIG. 15, the spacer liner 108 between the gate structures 104 is completely removed and the contact opening 315 is formed between the gate structures 104. In some embodiments, the spacer liner 108 is removed by an etching process. Next, as shown in FIG. 16, the etch resistant layer 316 is conformally formed covering the sidewalls and the bottom of the contact openings 315.

Figure 17:
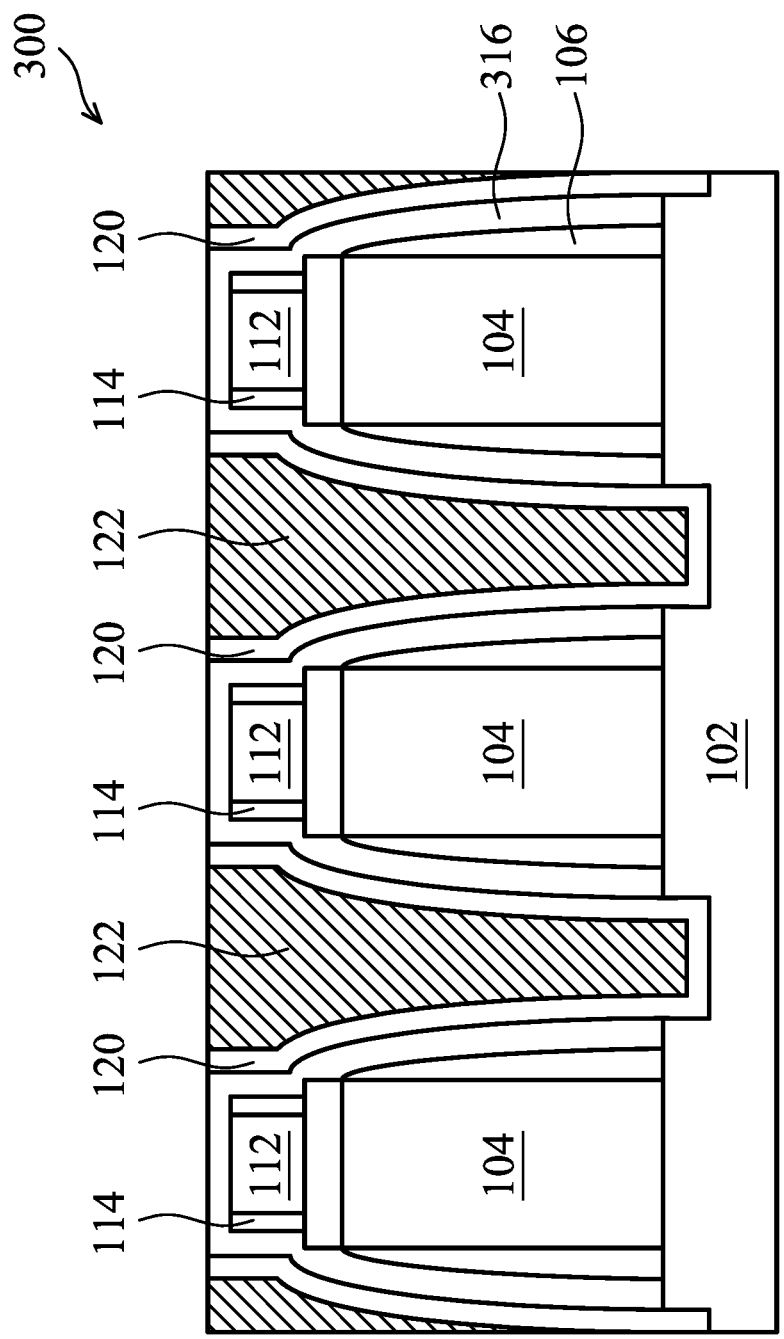

Next, following the process of FIG. 9, the thermal process 118 is performed, and the following steps are performed. As shown in FIG. 17, contact plugs 122 are formed in the contact openings 315, and a self-aligned contact structure 300 is formed.

In some embodiments as shown in FIGS. 14 and 15-17, by removing the spacer liner 108 from the contact openings 315, the uniformity and the quality of the sidewall films may be improved, without affecting the aspect ratio of the contact openings 315. This prevents narrowing the process window of forming the self-aligned contact structure 300, and may further prevent leakage current between the subsequently formed contact plugs 122 and the gate structures 104.

As mentioned above, in the present disclosure, a method of forming a self-aligned contact is provided. After removing the sacrificial layer and before forming the contact plugs, the etch resistant layer is conformally formed on the sidewalls and the bottom of the contact openings. The etch resistant layer may provide electrical isolation between the contact plugs and the gate structures, preventing short-circuits and leakage current caused by the loss of the spacer liner on the gate structures. The densification of the etch resistant layer by the thermal process may further improve the quality of the etch resistant layer, preventing leakage current from passing through the etch resistant layer.

What is claimed is:

1. A method for forming a self-aligned contact (SAC), comprising:
   providing a substrate with a plurality of gate structures formed on the substrate;
   forming a spacer liner on a top surface of the gate structures and the substrate;
   forming a sacrificial layer between the gate structures and on the gate structures;
   forming a plurality of dielectric plugs through the sacrificial layer above the gate structures, wherein the spacer liner is between the plurality of dielectric plugs and the gate structures;
   removing the sacrificial layer to form a plurality of contact openings between the gate structures;
   after removing the sacrificial layer, conformally forming an etch resistant layer covering a sidewall and a bottom of the contact openings and a sidewall of the spacer liner between the plurality of dielectric plugs and the gate structures; and
   forming a plurality of contact plugs in the contact openings.

2. The method for forming a self-aligned contact as claimed in claim 1, wherein after forming the etch resistant layer, performing a thermal process on the etch resistant layer to densify the etch resistant layer.

3. The method for forming a self-aligned contact as claimed in claim 2, wherein the thermal process has a temperature of between 0° C. and 1000° C. and a duration of between 0 minutes and 100 minutes.

4. The method for forming a self-aligned contact as claimed in claim 1, wherein the etch resistant layer comprises oxides, nitrides, oxynitrides, or a combination thereof.

5. The method for forming a self-aligned contact as claimed in claim 1, wherein the spacer liner comprises oxides, nitrides, oxynitrides, or a combination thereof.

6. The method for forming a self-aligned contact as claimed in claim 1, wherein the forming of the contact plugs comprises:
   etching the conformally formed etch resistant layer and the spacer liner between the gate structures to expose the substrate;
   conformally forming a barrier layer covering the sidewall and the bottom of the contact openings; and
   filling the contact openings with a conductive material.

7. The method for forming a self-aligned contact as claimed in claim 1, further comprising:
   removing the spacer liner from the contact openings after removing the sacrificial layer and before forming the etch resistant layer.

8. The method for forming a self-aligned contact as claimed in claim 1, wherein a maximum width of the sacrificial layer between the gate structures is between 40% and 200% of a distance between the gate structures.

9. The method for forming a self-aligned contact as claimed in claim 1, wherein a height of the sacrificial layer between the gate structures protruding from the gate structures is between 10% and 100% of a height of the gate structures.

10. The method for forming a self-aligned contact as claimed in claim 1, wherein the gate structures have a pitch of between 0.1 μm and 0.3 μm in a first direction, and the sacrificial layer has a pitch of between 0.05 μm and 0.2 μm in a second direction, which is perpendicular to the first direction.

11. The method for forming a self-aligned contact as claimed in claim 1, wherein after removing the sacrificial layer, the spacer liner is partially removed to leave a remaining spacer liner on a sidewall of the gate structures and the etch resistant layer is in contact with the remaining spacer liner.

12. The method for forming a self-aligned contact as claimed in claim 1, wherein each of the gate structures comprises a gate and a spacer on a sidewall of the gate, the spacer liner is conformally formed on a top surface of the gate, a sidewall of the spacer and the substrate.

13. The method for forming a self-aligned contact as claimed in claim 12, wherein the spacer liner on the substrate and between the gate structures is removed after conformally forming the etch resistant layer.

* * * * *